US012696689B2

(12) United States Patent
Terebenec et al.

(10) Patent No.: US 12,696,689 B2
(45) Date of Patent: Jul. 28, 2026

(54) PROCESS FOR MANUFACTURING A PHASE CHANGE MATERIAL WITH A CRYSTALLOGRAPHIC STRUCTURE OF LAYERS SEPARATED BY VAN DER WAALS PSEUDO-GAPS

(71) Applicant: COMMISSARIAT A L'ENERGIE ATOMIQUE ET AUX ENERGIES ALTERNATIVES, Paris (FR)

(72) Inventors: Damien Terebenec, Grenoble Cedex (FR); Pierre-Olivier Noe, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 597 days.

(21) Appl. No.: 18/308,147

(22) Filed: Apr. 27, 2023

(65) Prior Publication Data

US 2024/0114806 A1　　Apr. 4, 2024

(30) Foreign Application Priority Data

Apr. 28, 2022　　(FR) ..................................... 22 04021

(51) Int. Cl.
H10N 70/00　　　(2023.01)
C30B 29/68　　　(2006.01)
(Continued)

(52) U.S. Cl.
CPC ........... H10N 70/041 (2023.02); C30B 29/68 (2013.01); C30B 33/02 (2013.01); H10N 70/021 (2023.02); H10N 70/231 (2023.02)

(58) Field of Classification Search
CPC .. H10N 70/041; H10N 70/021; H10N 70/231; H10N 70/026; H10N 70/826;
(Continued)

(56) References Cited

U.S. PATENT DOCUMENTS

2008/0106923 A1*　5/2008　Lung ................... G11C 11/5678
365/129
2011/0076825 A1　3/2011　Lung
(Continued)

FOREIGN PATENT DOCUMENTS

CN　　110571331 A　　12/2019
CN　　110571331 B　*　1/2021 ........... H10N 70/801

OTHER PUBLICATIONS

Lee et al. "Reduction of Defect Density in GaAs Films by Thermal Annealing" Applied Physics Letters, vol. 50, p. 31, (Year: 1987).*
(Continued)

*Primary Examiner* — Ratisha Mehta
*Assistant Examiner* — Sophia W Kao
(74) *Attorney, Agent, or Firm* — Oblon, McClelland, Maier & Neustadt, L.L.P.

(57) ABSTRACT

A method for manufacturing a phase change stack having a crystallographic structure made of layers separated by van der Waals pseudo-gaps, may include: providing a substrate; forming the stack on the substrate, including (i) forming the first layer, and (ii) forming the second layer on the first layer. Advantageously, after formation of the stack, at least one curing annealing is carried out. The curing annealing may be such that the stack has, after annealing, a nominal defect rate less than at least 50% of an initial defect rate of the stack.

20 Claims, 7 Drawing Sheets

(51) Int. Cl.
    *C30B 33/02*       (2006.01)
    *H10N 70/20*       (2023.01)

(58) Field of Classification Search
    CPC .. H10N 70/8828; H10N 70/235; C30B 29/68;
                             C30B 33/02
    See application file for complete search history.

(56)                   References Cited

U.S. PATENT DOCUMENTS

| | | |
|---|---|---|
| 2018/0033962 A1 | 2/2018 | Redaelli et al. |
| 2018/0114902 A1 | 4/2018 | Redaelli et al. |
| 2021/0359205 A1* | 11/2021 | Hwang ............... H10N 70/023 |

OTHER PUBLICATIONS

French Preliminary Search Report and Written Opinion issued Dec. 23, 2022, in French Application 22 04021 filed on Apr. 28, 2022, citing documents 1-5, 15 therein, 12 pages (with English Translation of Categories of Cited Documents).
Simpson et al., "Interfacial phase-change memory" Nature Nanotechnology, 2011, vol. 6, No. 8, 14 pages.
Hippert et al., "Growth mechanism of highly oriented layered $Sb_2Te_3$ thin films on various materials" Journal of Physics D: Applied Physics, 2020, vol. 53, No. 15, 1 page (Abstract Only).
Shelimova et al., "Homologous series of layered tetradymite-like compounds in the Sb—Te and GeTe—$Sb_2Te_3$ systems" Inorganic Materials, 2000, vol. 36, 1 page (Abstract Only).
Koma, "Van der Waals epitaxy for highly lattice-mismatched systems" Journal of Crystal Growth, 1999, vol. 201, 2 pages.
Li et al., "Controlled Synthesis of Topological Insulator Nanoplate Arrays on Mica", Journal of the American Chemical Society, 2012, vol. 132, pp. 6132 & 6134.

* cited by examiner

PROCESS FOR MANUFACTURING A PHASE CHANGE MATERIAL WITH A CRYSTALLOGRAPHIC STRUCTURE OF LAYERS SEPARATED BY VAN DER WAALS PSEUDO-GAPS

CROSS-REFERENCE TO RELATED APPLICATIONS

The present application claims the benefit of the filing date of French. Appl. No. 2204021, filed on Apr. 28, 2022.

TECHNICAL FIELD

The present invention generally relates to a method for manufacturing a phase change material, and more specifically, a method for manufacturing a multilayer stack comprising van de Waals gaps or pseudo-gaps. A particular application linked to the s implementation of this method is the manufacturing of phase change memories.

STATE OF THE ART

Phase change materials (PCM) thus form the subject matter of numerous applications in the field of phase change memories in microelectronics and in photonics or for thermoelectric converters.

In the field of phase change memories in particular, the most studied materials are polycrystalline PCM alloys located on the pseudo-binary GeTe—$Sb_2Te_3$ line of the Ge—Sb—Te ternary diagram. One of these materials which is the most known is $Ge_2Sb_2Te_5$. These materials typically have a so-called "metavalent" chemical bonding mechanism, which gives them unique physical properties differentiating them from other so-called covalent, metal, is etc. materials. Certain crystallographic phases of these PCM materials make it possible to accommodate the gaps present in the crystalline lattice by adopting a structure in the form of layers sparsely bonded together by very sparsely covalent homopolar bonds or of the van der Waals type. These weak bonds between crystalline layers or blocks in the structure of the PCM material are called van der Waals gaps or pseudo-gaps.

The document, "R. E. Simpson et al., Nature nanotechnology 2011, 6, 501" discloses a method for the improved structuring of these PCM materials. In this document, the polycrystalline $Ge_2Sb_2Te_5$ layer (serving as a reference) of phase change memory devices is replaced by a multilayer heterostructure of overall equivalent chemical composition and comprising alternate crystalline $(GeTe)_2$ and $Sb_2Te_3$ layers. Such a heterostructure also comprises van der Waals pseudo-gaps extending within the layers and/or between the alternate layers. Such a heterostructure typically corresponds to a super-lattice (SL) and is also called iPCM (interfacial Phase Change Material).

This solution based on SLs makes it possible to reduce the programming current by 40%, to increase the programming speed, and to improve the endurance of the memory device, compared with the device integrating the $Ge_2Sb_2Te_5$ PCM reference. Since 2011, this effect of SLs on the improvement of performances of memory devices has been confirmed by numerous groups in the world, but the mechanism starting the improvement of performances in devices integrating SLs still remains highly debated. However, it appears consensually that the best performances are obtained either by increasing the proportion of $Sb_2Te_3$ in the super-lattice by using, for example, thicker $Sb_2Te_3$ layers (4 nm instead of 1 nm, or 8 nm instead of 4 nm or 2 nm, for example), or by reducing the thickness of the GeTe layer.

An aim of the present invention is to improve the performances of phase change SLs, in particular for heterostructures having thin layers, in particular less than 8 nm.

Other aims, features and advantages of the present invention will appear upon examining the following description and the accompanying drawings. It is understood that other advantages can be incorporated.

SUMMARY

To achieve this aim, according to an embodiment, a method for producing a phase change stack (iPCM) is provided, comprising at least:
- a first layer of a first material A,
- a second layer of a second material B, different from the first material A, said stack having a crystallographic structure made of layers separated by van der Waals pseudo-gaps.

The method comprises at least the following steps:
A provision of a substrate,
A formation of the stack on a surface of the substrate, said formation comprising at least:
One formation of the first layer,
One formation of the second layer on the first layer.

Advantageously, in this method, at least one curing annealing is carried out after formation of the stack. The curing annealing is such that the stack has, after said annealing, a nominal defect rate less than 50% of an initial defect rate of the stack, taken before said annealing.

The works of the prior art teach that the best performances are obtained by increasing the thickness of the $Sb_2Te_3$ layers. The mechanism underlying this performance increase, according to the prior art, is the decreasing of the energy barrier necessary to make the GeTe layers transit from one crystallographic structure to another, under the effect of the mechanical stress exerted by the thickest $Sb_2Te_3$ layers on the GeTe layer.

Contrary to the approach retained in the prior art, it has been observed in the scope of the development of the present invention, that the presence of structural defects, and in particular, of stack faults in the heterostructure significantly and unsuspectingly contributed to the decrease of performances of the $Sb_2Te_3$ layers, in particular for thin $Sb_2Te_3$ layers, less than or equal to 8 nm.

Further to the investigations carried out in the scope of the present invention have shown that these are mainly stack faults and defects in the crystalline lattice which start with a loss of electronic and thermal properties, which are advantageous for PCM applications.

Among the possible different solutions to limit or avoid the presence of structural defects and to improve the crystalline quality of the stack, it has been advantageously chosen to implement, in the scope of the invention, a curing annealing of these structural defects, after formation of the stack. Thus, contrary to certain solutions of the prior art, the stoichiometry of the stack is preserved.

Preferably, an X-ray diffraction control step is carried out following the curing annealing, in order to verify that the defect rate of the stack has actually decreased. One or more other annealing actions can be carried out if the structural defect rate in the stack has not sufficiently decreased or has not reached a rate deemed acceptable according to the application targeted for such a stack. Preferably, the annealing action(s) are repeated or extended so as to achieve a zero defect rate.

According to an option, the curing annealing is carried out at a temperature less than is or equal to 500° C., preferably less than or equal to 450° C., and preferably strictly greater than 300° C. Such temperatures make it possible, in particular, for the method to be implemented during end of line steps, called BEOL (back end of line), in microelectronic manufacturing technologies.

The curing annealing is not a simulation annealing. It does not aim to simulate on the structure, a thermal budget applied during BEOL steps, for example.

BRIEF DESCRIPTION OF THE FIGURES

The aims, objectives, as well as the features and advantages of the invention will best emerge from the detailed description of embodiments of the latter, which are illustrated by the following accompanying drawings, wherein.

Figure 1:
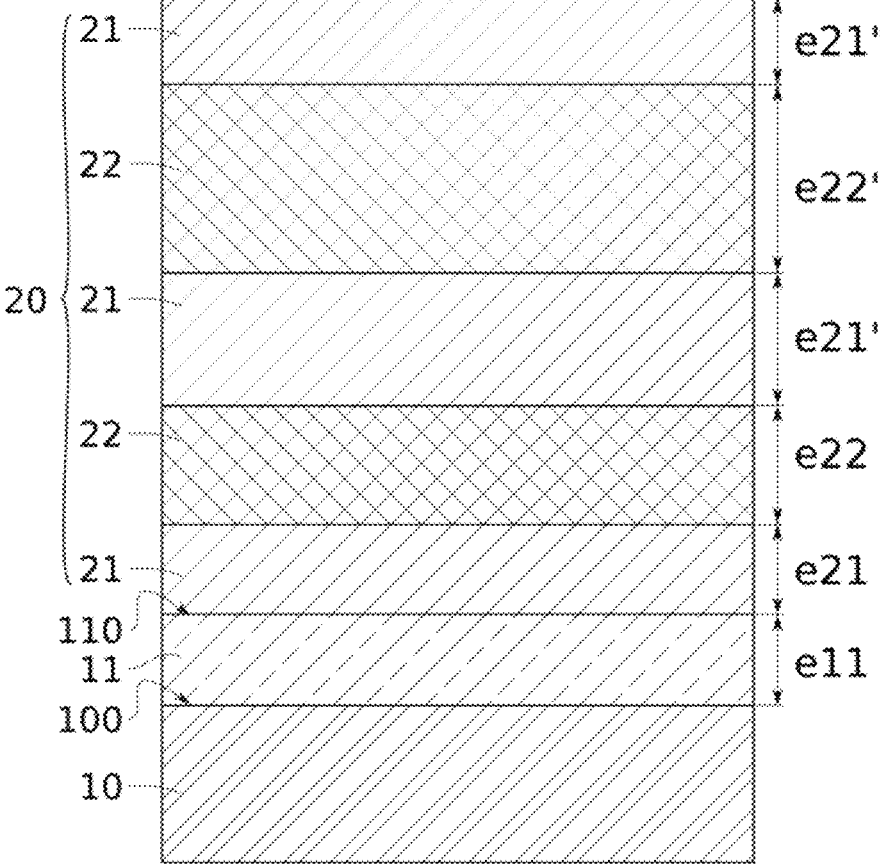
FIG. 1 illustrates a cross-section of an iPCM stack according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the thicknesses of the different layers are not representative of reality.

DETAILED DESCRIPTION

Before starting a detailed review of embodiments of the invention, optional features are stated below, which can optionally be used in association or alternatively:

According to an example, the method further comprises, after the curing annealing, a step for controlling the crystalline quality of the stack by X-ray diffraction (XRD).

According to an example, the method further comprises, after the at least one curing annealing, a determination of the defect rate in the stack based on a measurement by X-ray diffraction (XRD). This makes it possible to control that the structural defect rate of the stack has actually decreased following the curing annealing. According to an example, an additional curing annealing is carried out if the determined defect rate is greater than the nominal defect rate. The additional curing annealing can be carried out at a greater temperature and/or for a duration longer than the first curing annealing. In particular, when the diffraction diagram no longer develops before and after annealing, the defect rate is considered as minimal or zero.

According to an example, the method further comprises, after the at least one curing annealing, a determination of the defect rate in the stack based on an observation by electron microscopy, in particular by transmission electron microscopy. According to an example, the determination of the defect rate in the stack is made by X-ray diffraction and by transmission electron microscopy. Indeed, in certain cases, the Bragg peaks of the diffraction diagram are totally refined, while certain structural defects subsist in the stack, in particular when the crystalline defects are presented in the form of swapped bilayers. The complementary analysis by transmission electron microscopy makes it possible to determine if these types of defects which cannot be detected by XRD is also present in the stack coming from the curing annealing. Such a complementary analysis is particularly advantageous to evaluate the effectiveness of the curing annealing, which partially conditions the electronic and thermal properties of the material, and subsequently the performances of the devices based on this material.

According to an example, the method further comprises, after the at least one curing annealing, a plurality of steps of integrating the stack intended to form a phase change device with the basis of said stack, such as a phase change memory or a thermoelectric converter. The plurality of integration steps can typically comprise other annealing actions distinct from the curing annealing.

According to an example, the method further comprises, after formation of the stack and before the curing annealing step, a formation of an upper electrode layer on the stack. The formation of the upper electrode layer before the curing annealing step makes it possible to avoid the oxidation of the surface and/or an evaporation of the most volatile atoms of the stack, in particular tellurium atoms. This makes it possible to preserve the stoichiometry of the stack.

According to an example, the materials A and B are chosen from among tellurium (Te), antimony (Sb), Ge—Sb, Ga—Sb, Ge—Te, Ge—Se, GeSe$_2$, Sb—Te, Sb—Se, As—Se, As—Te, Sn—Se, Sn—Te, Bi—Se, Bi—Te, Ga—Te, Ga—Se, Pb—Te, In—Se, Pb—Se, Zr—Te, Zr—Se, Ti—Te, Ti—Se, Si—Te, Al—Te, Mo—Te, Mo—Se, W—S, W—Se binary alloys, Ge—Sb—Te, Ge—Se—Te, Ag—Sb—Te, Ge—Bi—Te, Ge—Sb—Se ternary alloys and Ge—Sb—Se—Te quaternary alloy, and a mixture of these alloys. In particular, the material A is a two-dimensional (2D) material chosen from is among:

transition metal dichalcogenides MX$_2$ (with M=Mo, W, and X=S, Se or Te), Graphene, Benzene, Phosphorene, Germanene, Silicene, Stanene, Borophene, h-BN, or 2D chalcogenide alloys like Sb—Te, Bi—Te, As—Se, As—Te, Ge—Sb—Te and their alloys.

The material B is typically chosen from among two-dimensional (2D) or three-dimensional (3D) materials such as Ge—Sb, Ga—Sb, Ge—Te, Ge—Se, Ge—Se, Sb—Te, Sb—Se, As—Se, As—Te, Sn—Se, Sn—Te, Bi—Se, Bi—Te, Ga—Te, Ga—Se, Pb—Te, In—Se, Pb—Se, Zr—Te, Zr—Se, Ti—Te, Ti—Se, Si—Te, Al—Te, Mo—Te, Mo—Se, W—S, W—Se alloys, Ge—Sb—Te, Ge—Se—Te, Ag—Sb—Te, Ge—Bi—Te, Ge—Sb—Se ternary alloys and Ge—Sb—Se—Te quaternary alloy, and a mixture of these alloys.

According to an example, the first layer with the basis of the material A and/or the second layer with the basis of the material B are deposited by van der Waals epitaxy.

According to an example, the curing annealing is carried out at a temperature less than or equal to 500° C., preferably less than or equal to 450° C. This makes it possible for the method to be implemented during BEOL (back end of line) steps, in microelectronic manufacturing technologies.

According to an example, the temperature of the curing annealing is greater than a maximum stack formation temperature.

According to an example, the temperature of the curing annealing is strictly greater than 300° C.

According to an example, the curing annealing is maintained at said temperature for a duration strictly greater than 20 minutes, preferably greater than or equal to 1 hour.

According to an example, the curing annealing is carried out, in particular its parameters are adjusted, such that the stack has, after said annealing, a nominal defect rate less than at least 50% of an initial defect rate of the stack, taken before said annealing. These parameters are taken from among at least some of: temperature, duration, evolution curve of the temperature over time, for example a temperature increase/decrease ramp. According to an example, the curing annealing is carried out, such that the stack has, after said annealing, a nominal defect rate less than 40% of the initial defect rate of the stack, taken before said annealing. According to an example, the curing annealing is carried out, such that the stack has, after said annealing, a nominal defect rate less than 20%, even 10% of the initial defect rate of the stack, taken before said annealing.

According to an example, the method further comprises, before the formation of the stack, a formation of an orientation layer configured to orient the stack along the crystallographic axis c, the formation of the stack, thus being done on a surface of said orientation layer.

According to an example, the orientation layer is with the basis of $Sb_2Te_3$ or of $Bi_2Te_3$ and has a thickness less than or equal to 10 nm.

According to an example, the formation of the first and second layers is done by deposition of the materials A and B in amorphous form, and the formation of the stack further comprises, after said depositions of the materials A and B in amorphous form, a crystallisation annealing carried out at a temperatures less than or equal to 300° C. The crystallisation annealing makes it possible to obtain the crystallographic structure of the stack, said structure being oriented along c thanks to the orientation layer underlying the stack.

According to an example, the method further comprises, before the formation of the stack, a step of passivating the surface on which the stack is formed with tellurium or antimony. This makes it possible to facilitate the formation of the stack by so-called van der Waals epitaxy, where the growth is done in the form of layers oriented along c and separated by van der Waals pseudo-gaps.

According to an example, the formation of the stack comprises a plurality of formations of first alternate layers with a plurality of formations of second layers, such that the structure of the stack is multilayer and comprises a plurality of first and second alternate layers.

According to an example, at least some of the first layers have different thicknesses, and/or at least some of the second layers have different thicknesses, such that the multilayer structure of the stack is aperiodic. An aperiodic multilayer structure is easier to achieve than a fully periodic multilayer structure. A manufacturing constraint is removed. This facilitates the manufacturing of the stack.

According to an example, the substrate comprises a lower electrode configured to make a localised phase change of the stack.

According to an example, each van der Waals pseudo-gap separating two layers of the crystallographic structure is presented in the form of a spacing between two pure planes of a same atom type, said spacing having a dimension normal to the planes less than or equal to twice the van der Waals radius of said atom type. The bonds between the atoms through the van der Waals pseudo-gap are typically shorter and stronger than ordinary van der Waals bonds. The van der Waals gaps are a particular case of van der Waals pseudo-gaps, for which the spacing has a dimension normal to the planes equal to twice the van der Waals radius of the atom type. Thus, the van der Waals pseudo-gaps include, by is definition, the van der Waals gaps.

Unless incompatible, it is understood that all of the optional features above can be combined so as to form an embodiment which is not necessarily illustrated or described. Such an embodiment is clearly not excluded from the invention. The features of an aspect of the invention, for example the device or the method, can be adapted mutatis mutandis to the other aspect of the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a stack, a layer "with the basis" of a material A, this means a substrate, a stack, a layer comprising this material A only or this material A and optionally other materials, for example alloy elements and/or doping elements.

Several embodiments of the invention implementing successive steps of the manufacturing method are described below. Unless explicitly mentioned, the adjective "successive" does not necessarily imply, even if this is generally preferred, that the steps immediately follow one another, intermediate steps could separate them.

Moreover, the term "step" means the carrying out of some of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions overtime and in the sequence of phases of the method.

A preferably orthonormal marker, comprising the axes x, y, z is represented in the accompanying figures. When one single marker is represented on one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under", "underlying", "inserted" refer to positions taken along the direction z.

The terms "vertical", "vertically" refer to a direction along z. The terms "horizontal", "horizontally", "lateral", "laterally" refer to a direction in the plane xy. Unless explicitly mentioned, the thickness, the height and the depth are measured along z.

An element located "in vertical alignment with" or "to the right of" another element, means that these two elements are both located on one same line perpendicular to a plane, wherein a lower or upper face of a substrate mainly extends, i.e. on one same line oriented vertically in the figures.

In the scope of the present invention, the stack has a phase change material-based multilayer crystalline structure. This structure typically has, in its lowest energy configuration, crystalline blocks oriented about their crystallographic axis c and separated by very sparsely covalent homopolar bonds, or bonds of the van der Waals type. These bonds can be, for example. Te—Te, Se—Se, or S—S bonds in chalcogenides. The large spacing between the planes linked by these bonds is generally attributed to the existence of a van der Waals gap plane, which is called van der Waals (vdW) gap or pseudo-gap. This particular structure form is observed, in particular for phase change materials PCM, chalcogenides, and more generally for materials having a so-called "metavalent" chemical bonding mechanism. These materials are frequently described as 2D materials linked by van der Waals bond. This description can however be expanded, as the distance between planes through the vdW gap is generally shorter than twice the van der Waals radius of the atoms constituting these planes. For example, in the case of tellurium, the Te—Te distance through the vdW gap is around 10% shorter than twice the van der Waals radius of the Te.

The materials of the following non-exhaustive list typically adopt, as a multilayer stack, the heterostructure with vdW gaps or pseudo-gaps described above: tellurium, antimony, Ge—Sb, Ga—Sb, Ge—Te, Ge—Se, GeSe$_2$, Sb—Te, Sb—Se, As—Se, As—Te, Sn—Se, Sn—Te, Bi—Se, Bi—Te. Ga—Te, Ga—Se, Pb—Te. In—Se, Pb—Se, Zr—Te, Zr—Se, Ti—Te, Ti—Se. Si—Te, Al—Te, Mo—Te, Mo—Se, W—S, W—Se binary alloys, Ge—Sb—Te, Ge—Se—Te, Ag—Sb—Te, Ge—Bi—Te, Ge—Sb—Se ternary alloys, Ge—Sb—Se—Te even Ge—Bi—Sb—Te—Se quaternary alloys.

The examples of the embodiment of the method described below are illustrated by a stack comprising alternate GeTe layers with Sb$_2$Te$_3$ layers. It is understood that all of the materials indicated above can be implemented in the method of the embodiment of a multilayer stack according to the invention. The PCM alloys located on the GeTe—Sb$_2$Te$_3$ pseudo-binary line of the Ge—Sb—Te ternary diagram, for example Ge$_2$Sb$_2$Te$_5$, Ge$_1$Sb$_2$Te$_4$, Ge$_1$Sb$_4$Te$_7$, are in particular considerable for the implementation of the method. Alloys such as doped Sb$_2$Te (Ag, In), of the AIST family, and their derivatives, are also considerable. Chalcogenides and sesqui-chalcogenides, such as Bi$_2$Te$_3$, are also considerable.

By defect rate, this means a number of defects in the crystalline structure per volume unit or, if necessary, a number of defects per surface unit. A number of defects per volume unit can typically be estimated by X-ray diffraction, for example from the mid-height width of the diffraction peaks 001 of the crystalline structure of the stack. A number of defects per surface unit can typically be quantified by transmission electron microscopy, from a cross-section, in particular.

FIG. 1 illustrates, as a cross-section, a stack 20 of alternate layers 21, 22 of PCM materials. The layers 21 can be, in this case, Sb$_2$Te$_3$-based, and the layers 22 can be GeTe-based. Three layers 21 and two layers 22 are, in this case, illustrated for clarity. The stack 20 typically comprises at least one layer 21 and at least one layer 22. The number of layers 21, 22 can be adjusted according to the total thickness sought for the stack. The layers 21 typically have thicknesses e21, e21', e21" of between 1 and 20 nanometres with a thickness proportional to a whole number of van der Waals blocks, that is, for example, in the case of Sb$_2$Te$_3$ where a block measures around 1 nm about its axis c: 2 nm, 4 nm, 8 nm or 16 nm. These thicknesses e21, e21', e21" are not necessarily equal to one another. The layers 22 typically have thicknesses e22, e22' of between 0.5 and 10 nanometres thick proportional to an elementary number of blocks of the crystalline structure of the material of the layer 22, for example 0.7 nm in the case of GeTe corresponding to a (GeTe)$_2$ block. These thicknesses e22, e22' are not necessarily equal to one another. When at least some of the thicknesses of the layer 21, and/or at least some of the thicknesses of the layers 22 are not equal to one another, the stack 20 is periodic. In the scope of the development of the present invention, it has been observed that the performances of the stack were not linked to the periodicity of the layers 21, 22 of PCM materials. This makes it possible to release the constraint precisely in thickness required during the formation of these layers 21, 22.

As explained above, the crystalline structure of such a stack 20 has vdW pseudo-gaps regularly distributed along the height of the stack.

According to an example, the stack 20 comprises (GeTe)$_2$ and Sb$_2$Te$_3$ blocks of respective thicknesses 0.7 nm and Xnm, referenced 0.7/X. The value 0.7 nm corresponds to the thickness of an elementary rhombohedral (GeTe)$_2$ block. The value Xnm correspond to the thickness of the trigonal Sb$_2$Te, blocks, which can typically be of between 1 and 20 nm, for example, X=2, X=4, X=8 nm.

The Sb$_2$Te$_3$ blocks typically have groups of five QL layers (quintuple layers), sparsely coupled to one another, and constituted of Te—Sb—Te—Sb—Te planes perpendicular to the direction [001] according to the hexagonal indexing of the trigonal Sb$_2$Te$_3$ structure. The QL groups have a height of 1.015 nm. The single hexagonal cell contains 3 QL (c=3.0458 nm). Inside a QL group, Sb and Te are covalently or metavalently bonded. The QL groups are typically separated by a spacing of 0.275 nm of height This spacing corresponds to a vdW pseudo-gap.

Figure 2:
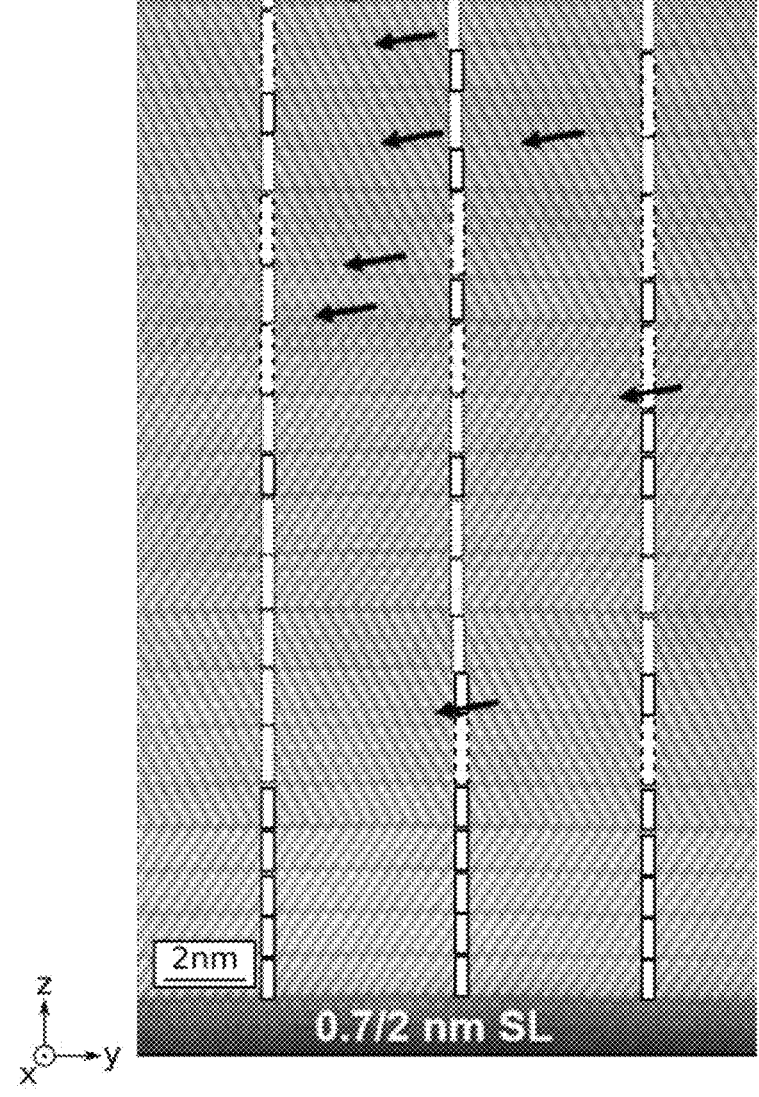
FIG. 2 is a scanning transmission electron microscopy (STEM) image, as a cross-section of an iPCM stack before curing annealing according to an embodiment of the present invention.

FIG. 2 is a scanning transmission electron microscopy (STEM) image, illustrating such a stack 20 formed from (GeTe)$_2$ and Sb$_2$Te$_3$ blocks of respective thicknesses 0.7 nm and 2 nm. The arrangement in QL groups separated by vdW pseudo-gaps is clearly visible. The alternate dotted line, large dotted line, small dotted line and solid line segments correspond to Ge$_x$Sb$_y$Te, ternary alloys, respectively to GST326, GST225, GST124, and to Sb$_2$Te$_3$ QLs.

The stack 20 is typically formed on the surface 100 of a substrate 10 which can be, silicon-, amorphous silicon-, amorphous silicon oxide-based. Other materials are also considerable for the substrate 10, at least at the level of its surface 100, for example TiN, WSi, W, TiSiN, TaN and carbon. Carbon can, for example, be advantageously used as a diffusion barrier in memory devices. According to an option, the substrate 10 comprises a lower electrode connecting the stack 20.

An orientation layer 11 can be advantageously inserted between the stack 20 and the substrate 10. The stack 20 is thus formed on the surface 110 of this orientation layer 11. The orientation layer 11 is configured to orient the crystalline structure of the stack 20 about the crystallographic axis c. This orientation layer 11 can be presented in the form of a fully stoichiometric Sb$_2$Te$_3$ or Bi$_2$Te$_3$ film, of thickness e11 of around a few nanometres (typically 5 nm for Sb$_2$Te$_3$). This orientation layer 11 can be formed by physical vapour deposition PVD, by using, for example, a method for co-sputtering Sb and Te or Sb$_2$Te$_3$ and Te targets by adjusting the powers on each of the targets. The use of a Te-enriched Sb$_2$Te$_{3+x}$ target is also considerable. This makes it possible to compensate for a possible tellurium deficit during the formation of the passivation layer 11. The passivation layer 11 can thus have a s Te-non-deficit or Te-enriched surface layer formed, for example, by a pure Te atom plane.

The stack 20 can be directly formed by epitaxy, for example at a temperature of between 180° and 300° C. for $Sb_2Te_3$. The epitaxial deposition of the different layers 21, 22 can be carried out from one of the following deposition techniques: pulsed laser deposition PLD, molecular beam epitaxy MBE, physical vapour deposition PVD, molecular vapour phase epitaxy MOVPE, chemical vapour deposition CVD, atomic layer deposition ALD, evaporation deposition, molecular chemical vapour deposition MOCVD.

Alternatively, the stack 20 can be formed indirectly from an amorphous deposition of the layers 21, 22, followed by a crystallisation annealing. In this case, the orientation layer 11 is necessary to enable the orientation of the multilayer structure of the stack about the is crystallographic axis c during crystallisation.

According to a preferred option, the surface 100 of the substrate 10 can be passivated by a tellurium or antimony input, for example. This improves the epitaxy of the orientation layer 11 and/or of the first layer 21. According to an example, the tellurium input during the deposition of an $Sb_2Te_3$— or $Bi_2Te_3$-based orientation layer 11 makes it possible to passivate the growth surface 100 by a Te-rich surface layer ending with an atomic Te monolayer. This makes it possible, in particular, to carry out a van der Waals epitaxy correctly oriented on any type of substrate 10.

As illustrated in FIG. 2 by the black arrows, the super-lattice 0.7/2 nm has, after epitaxy of numerous stack faults. These stack faults are mainly located at the van der Waals gaps, between the PCM material blocks.

It has been observed in the scope of the development of the present invention, that the density of these structural defects is linked:

to the energy difference between the heterostructure obtained after epitaxy and the equivalent chemical composition structure found at the thermodynamic equilibrium. This difference depends, in particular, on the nature of the GST blocks formed in the SL by local mixture of the GeTe and $Sb_2Te_3$ films. This difference at the thermodynamic equilibrium ultimately depends on the energy necessary for the diffusion of the chemical species making it possible to extend to the GST block stack of lower energy;

to a local Te deficit in the structure, which induces the local formation of bilayer defects;

to the deposition temperature, which prevents an atomic mobility which is sufficient to accommodate the defects;

to the thickness of the $Sb_2Te_3$ layers.

A principle of the invention therefore consists of carrying out a suitable annealing, after the formation of the stack, typically of around 400° C. to 500° C., for example 450° C., for a duration of several minutes to several hours to bring the structure such as deposited in its lower energy state. This low energy state corresponds to a structure fully oriented about its axis c having blocks for which the diffusion of the chemical species is completed and separated by vdW pseudo-gaps, without or with hardly any stack faults. According to an example, a stack 20 of the SL 0.7/2 nm $(GeTe)_2/(Sb_2Te_3)_2$ type is subjected to a curing annealing at 450° C. for 60 minutes to form a GST 124-oriented crystal without defects at the vdW gaps.

The curing annealing is typically carried out at a temperature greater than the is temperature for forming the stack 20, for example, at a temperature greater than 300° C. Advantageously, the curing annealing is carried out at a temperature which is compatible with the BEOL integration steps, i.e. at a temperature less than the temperatures implemented during these BEOL integration steps, typically at a temperature less than or equal to 500° C. The curing annealing makes it possible to decrease the density of structural defects, in particular of stack faults, in the crystalline structure of the stack 20. The parameters of the curing annealing are preferably adjusted so as to obtain a number of defects after annealing, less than or equal to 50% of the number of defects initially present in the stack, before annealing. According to an option, the number of structural defects after curing annealing is less than or equal to 60% of the initial number of defects in the stack, preferably less than 20%, even 10%. One or more curing annealing actions can be carried out successively. In particular, if the density of structural defects has not sufficiently decreased from the first curing annealing, a second curing annealing at a greater temperature and/or for a longer duration can be carried out.

The parameters of the curing annealing action(s) are taken from among at least some of the following parameters: temperature, duration, evolution curve of the temperature over time, for example a temperature increase/decrease ramp. By modifying these fully conventional parameters, the defect rate is reduced.

The final state of the structure and the effectiveness of the curing annealing can, in particular, be controlled by means of X-ray diffraction. Thus, to determine the defect rate, this can for example be based on an X-ray diffraction (XRD) measurement. A so-called "rocking curve" analysis can also be carried out from the curing annealing to verify that the different layers of the stack are parallel to the substrate. In particular, the different curves of the stack are considered as being parallel to the substrate when the rocking curve of a Bragg peak does not exceed the mid-height width of 10°.

According to an option, the stack 20 is encapsulated before curing annealing. This makes it possible to avoid an evaporation of tellurium during the curing annealing. An upper electrode can be formed on the stack. The stack 20 can thus be sandwiched between the lower electrode and the upper electrode, so as to form a PCM memory cell.

Figure 3:
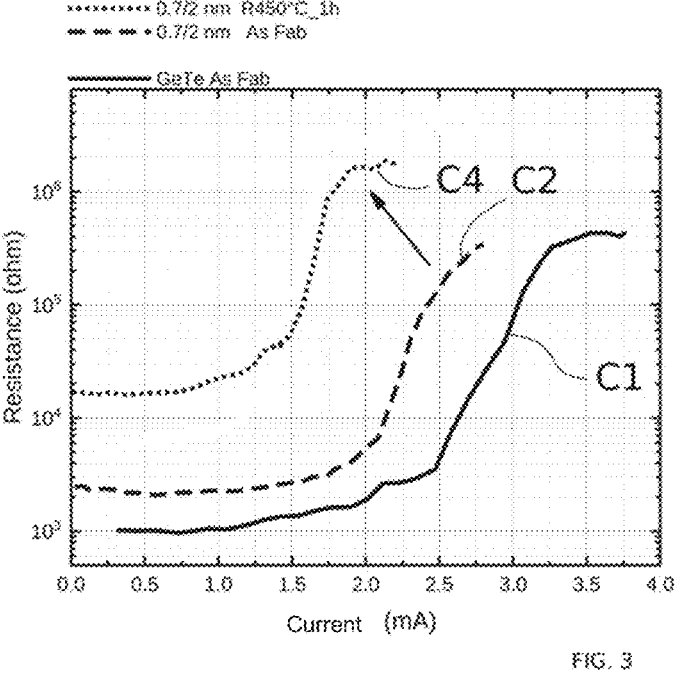
FIG. 3 illustrates R(I) curves for different PCM and iPCM stacks, with or without curing annealing, according to an embodiment of the present invention.

FIG. 3 illustrates electric tests carried out on memory devices integrating different phase change stacks. R is the value measured of the resistance of the memory cell according to the current injected during the successive application of programming voltage pulses. The curve C1 corresponds to a reference PCM stack (GeTe polycrystalline alloy), without super-lattice structuring. The curve C2 corresponds to a GeTe/$Sb_2Te_3$ 0.7/2 nm iPCM stack, such as illustrated in FIG. 2. The curve C4 corresponds to a GeTe/$Sb_2Te_3$ 0.7/2 nm iPCM stack after curing annealing at 450° for 1 hour.

The best performances, i.e. the lowest programming currents, correspond to the curve C4. It thus appears that the 0.7/2 nm iPCM stack after annealing has a performance level significantly greater than the same stack without curing annealing. This 0.7/2 nm iPCM performance level after annealing is typically comparable to that of a 0.7/8 nm iPCM stack without annealing.

Transmission electron microscopy has shown that the major difference in the initial crystalline structures of the 0.712 nm and 0.7/8 nm iPCMs comes from the stack fault density in their crystalline structure. Indeed, after formation, the 0.7/8 nm iPCM has an initial stack fault density four times lower than the 0.7/2 nm iPCM. This difference in the order of the crystalline structure is also observed by X-ray diffraction (XRD), where the 0.7/8 nm structure has narrower Bragg peaks which are of comparable widths or identical to one another, contrary to the 0.7/2 nm sample which has, before annealing, wide peaks and narrower peaks. This indicates that the 0.7/8 nm structure has less disorder and/or less defects than the 0.7/2 nm structure.

Figure 4:
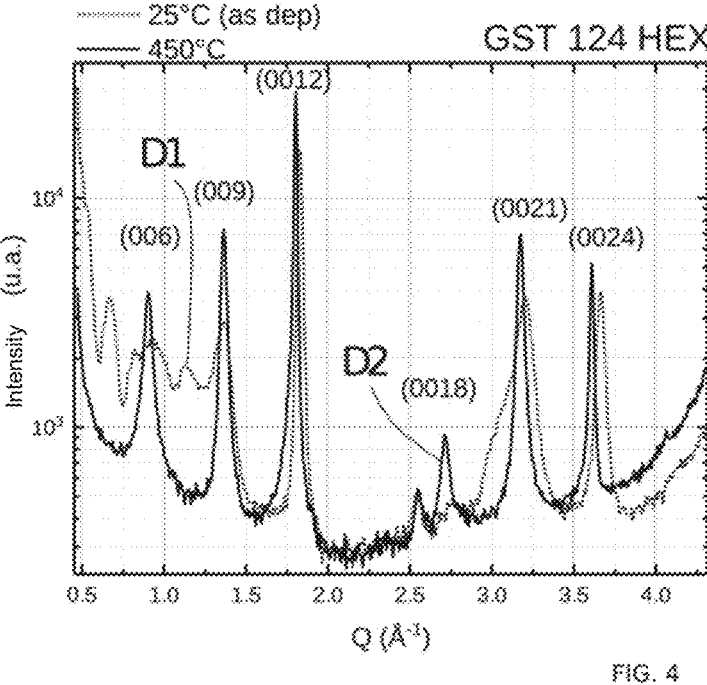
FIG. 4 illustrates diffractograms produced on an iPCM stack before and after curing annealing, according to an embodiment of the present invention.

FIG. 4 has X-ray diffraction diagrams for $GeTe/Sb_2Te_3$ 0.7/2 nm iPCMs with and without curing annealing. The curve D1, corresponding to the 0.7/2 nm stack before annealing, has wide peaks indicating a disordered crystalline structure. The curve D2, corresponding to the 0.7/2 nm stack after annealing at 450° C. for 1 hour, has thinner peaks of homogenous mid-height width. The indexing of these Bragg peaks corresponds to a GST 124 ($Ge_1Sb_2Te_4$) hexagonal phase oriented about the axis c. This phase corresponds to the most stable crystalline structure, of lower energy, for this stack.

The refinement of the peaks after annealing is attributable to a deceased in the disorder in the crystalline structure. The curing annealing makes it possible, in particular to reduce or remove the number of stack faults in the crystalline structure of the iPCM stack.

According to a preferred option, an X-ray diffraction control step is carried out after the curing annealing. Such a step is typically carried out on a solid plate, before the formation of final memory devices. Advantageously, the XRD control is non-destructive, and can easily be integrated with the PCM device manufacturing steps. If the diffractogram obtained has well-defined peaks, of homogenous and indexable mid-height width, the curing annealing is considered sufficient and the subsequent memory device manufacturing steps can be implemented. If the diffractogram obtained has at least some wide or barely-defined peaks, the curing annealing is considered insufficient and a second curing annealing can be implemented, in particular at a higher temperature and/or for a longer duration. One or more curing annealing actions, followed by one or more XRD controls, can thus be carried out in order to obtain an iPCM stack of good crystalline quality, having sparse or no structural defects, and in particular, sparse or no stack faults.

According to an option, a transmission electron microscopy control step is carried out after the curing annealing, alternatively or combined with an X-ray diffraction control. Indeed, in certain cases, the Bragg peaks of the diffraction diagram are totally refined, while certain structural defects subsist in the stack, in particular when the crystalline defects are presented in the form of swapped bilayers. FIGS. 5A, 5B, 5C, 5D illustrate transmission electron microscopy (TEM) analyses carried out respectively on the stack such as deposited, the stack after curing annealing at 300° C. for 15 minutes, the stack after curing annealing at 415° C. for 1 hour, the stack after a first curing annealing at 415° C. for 1 hour followed by a second curing annealing at 450° C. for 15 minutes. The structural defects are indicated by arrows on the TEM images of FIGS. 5A, 5B, 5C, 5D. It appears that only the stack having undergone the first curing annealing at 415° C. for 1 hour followed by the second curing annealing at 450° C. for 15 minutes (FIG. 5D) has no structural defects.

Figure 5A:
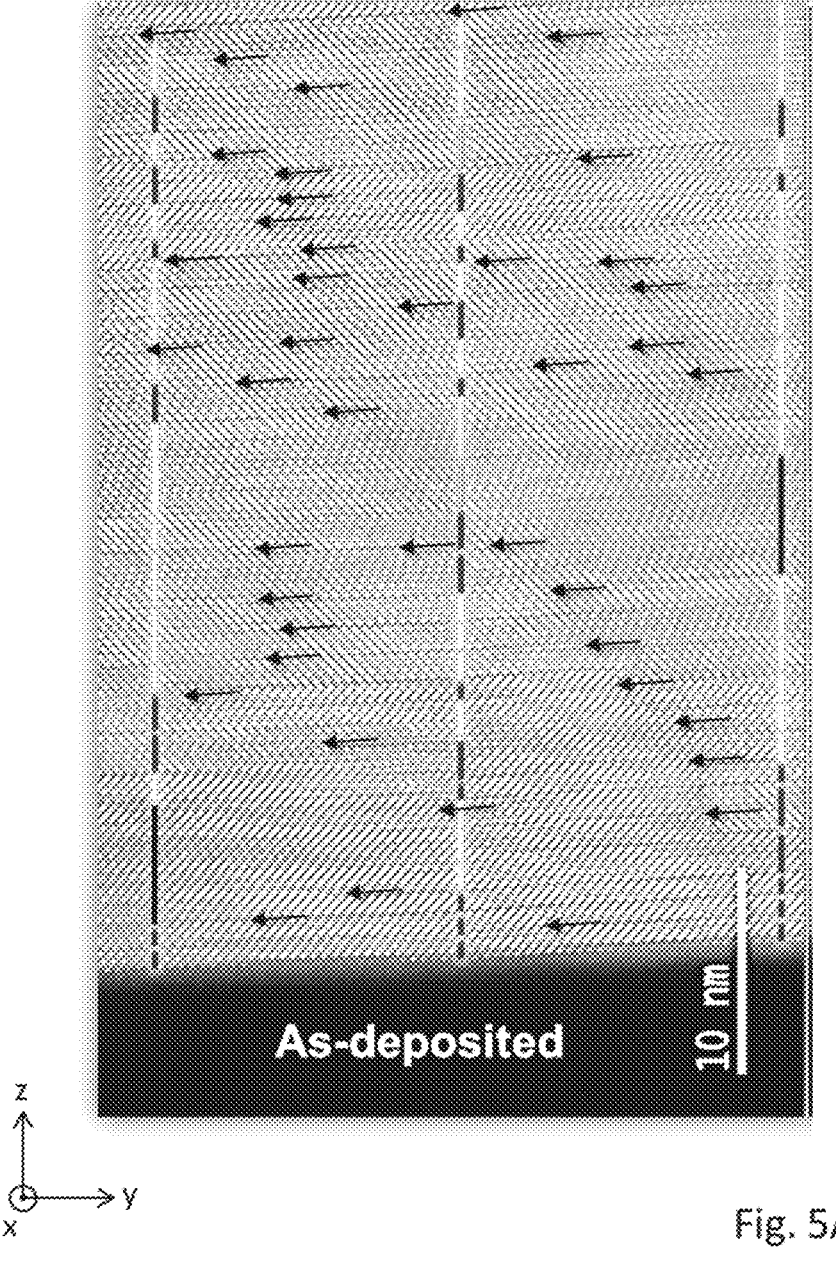
FIGS. 5A, 5B, 5C, 5D illustrate transmission electron microscopy (TEM) analyses carried out on different iPCM stacks before and after curing annealing, according to an embodiment of the present invention.
Figure 5B:
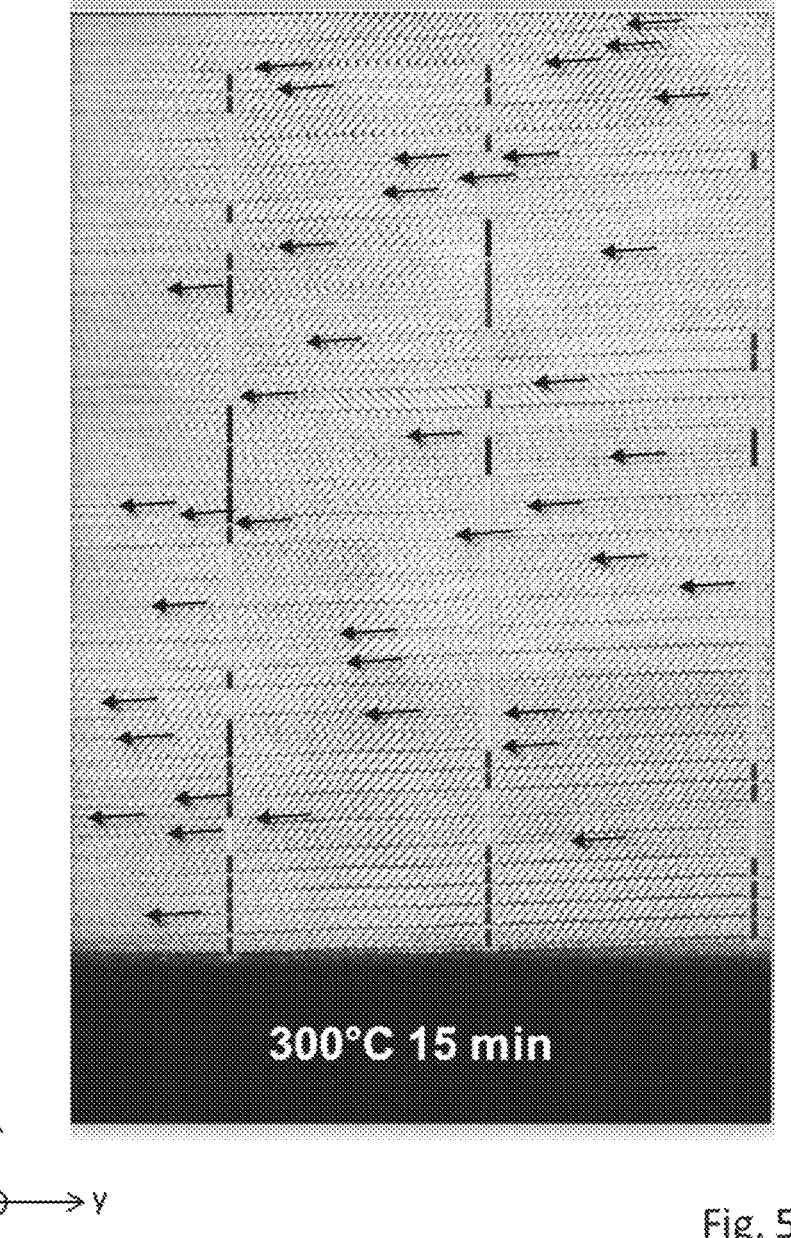
Figure 5C:
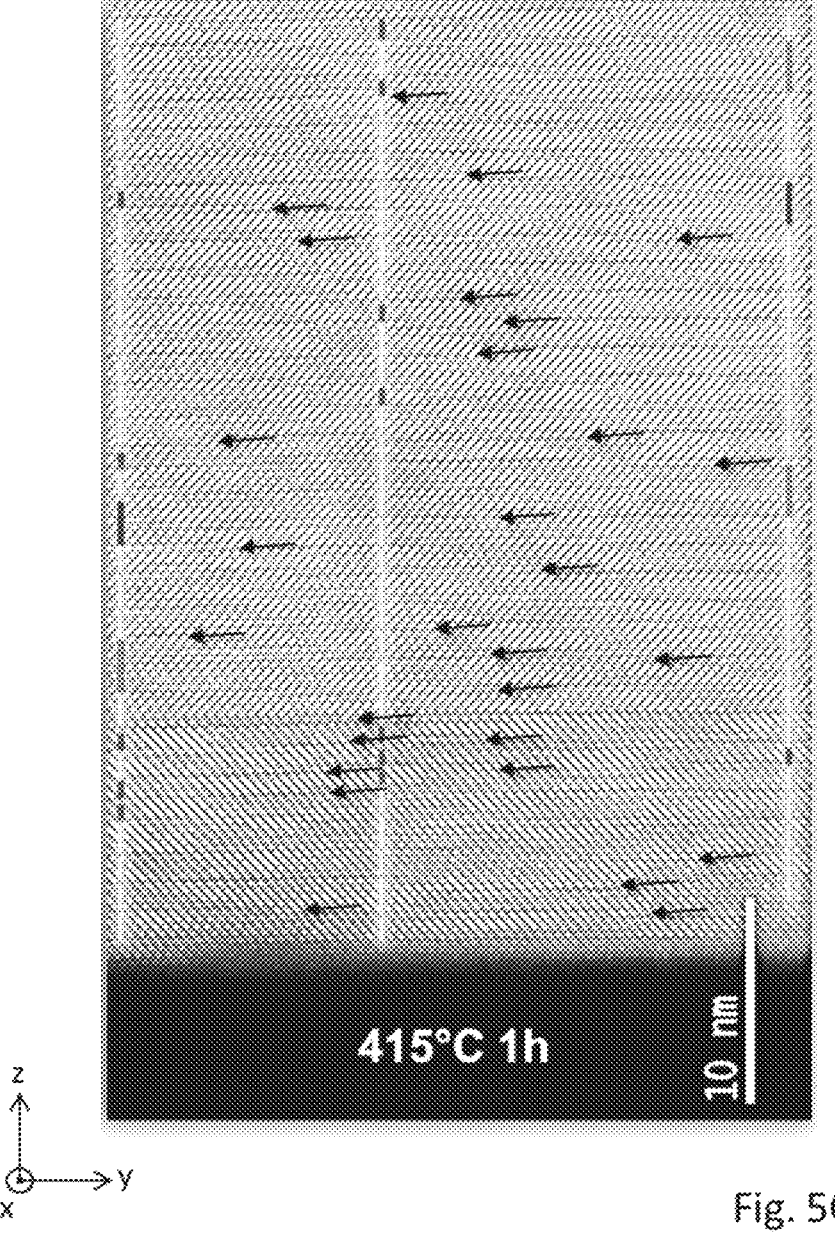
Figure 5D:
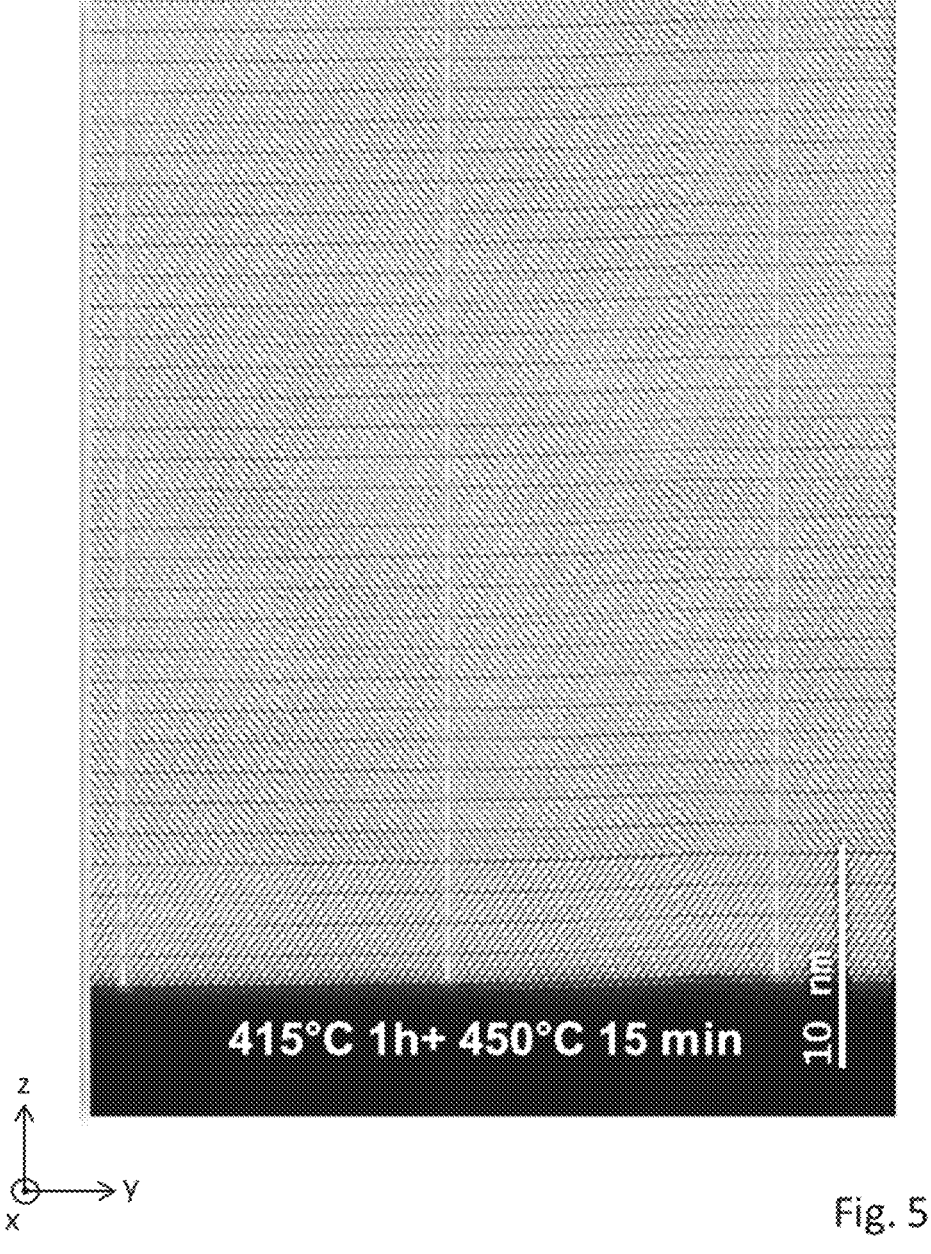

The diffractogram obtained on the stack which can be seen in FIG. 5C has totally refined Bragg peaks (not illustrated), like the diffractogram obtained on the stack which can be seen in FIG. 5D (not illustrated). Yet, it appears that the stack which can be seen in FIG. 5C also has a certain number of defects, in particular of the "swapped bilayers" type, which have not been totally removed from the curing annealing at 415° C. for 1 hour. The implementation of a complementary analysis by transmission electron microscopy therefore advantageously makes it possible to improve the detection and the determination of the defect rate in the stack, combined with or alternatively to the XRD analysis. This makes it possible to evaluate the necessity to carry out, or not, additional curing annealing actions.

This manufacturing method can be extended to all heterostructures or phases having vdW gaps or pseudo-gaps in their crystalline structure. This method can be extended to a s large range of materials, deposition techniques and applications. The applications requiring phase change chalcogenide materials or van de Waal gaps can relate to the fields of photonics, PCM resistive methods, neuromorphism, thermoelectricity, radiofrequencies, optics, spintronics. The invention is not limited to the embodiments described above.

The invention claimed is:

1. A method for manufacturing a phase change stack, the method comprising:

forming an orientation layer, configured to orient the phase change stack about a crystallographic axis c; and, thereafter forming a phase change stack on a surface of a substrate, comprising (i) forming a first layer comprising a first material A, and (ii) forming a second layer, comprising a second material B, different from the first material A, on the first layer; and after the forming of the phase change stack, first curing annealing such that the phase change stack has, after the curing annealing, a once-annealed nominal-defect rate less than 50% of an initial defect rate of the phase change stack, taken before the curing annealing, wherein the phase change stack has a crystallographic structure made of layers separated by van der Waals pseudo-gaps and comprises:

the first layer of the first material A, and the second layer of the second material B, and wherein the forming of the phase change stack is done on a surface of the orientation layer.

2. The method of claim 1, further comprising, after the first curing annealing:

determining a defect rate in the phase change stack based on an X-ray diffraction (XRD) measurement.

3. The method of claim 2, further comprising:

second curing annealing if the defect rate in the determining is greater than the once-annealed defect rate.

4. The method of claim 1, further comprising, after the first curing annealing:

carrying out a plurality of stack integrations, to form a phase change device with a basis of the phase change stack.

5. The method of claim 1, wherein parameters of the first curing annealing are chosen such that the phase change stack has, after the first curing annealing, a once-annealed defect rate less than 60% of an initial defect rate of the phase change stack, taken before the first curing annealing.

6. The method of claim 1, further comprising, after the forming of the phase change stack and before the first curing annealing:

forming an upper electrode layer on the phase change stack.

7. The method of claim 1, wherein the material A is a two-dimensional material comprises a transition metal dichalcogenide of formula $MX_2$, with M being Mo or W and X being S, Se, or Te, graphene, benzene, phosphorene, germanene, silicene, stanene, borophene, h-BN, or a two-dimensional chalcogenide alloy.

8. The method of claim 1, wherein the first layer comprising the material A and/or the second layer comprising the material B are deposited by van der Waals epitaxy.

9. The method of claim 1, wherein the first curing annealing is carried out at a temperature less than or equal to 500° C.

10. The method of claim 9, wherein the temperature of the first curing annealing is greater than a maximum stack formation temperature.

11. The method of claim 9, wherein the temperature of the first curing annealing is greater than 300° C.

12. The method of claim 1, wherein the orientation layer comprises $Sb_2Te_3$ or $Bi_2Te_3$-based, and has a thickness less than or equal to 10 nm.

13. The method of claim 1, wherein the forming of the first and second layers comprises depositing the materials A and B and in amorphous form, wherein the forming of the phase change stack further comprises, after the depositing of the materials A and B in amorphous form:

crystallization annealing carried out at a temperature less than or equal to 300° C.

14. The method of claim 1, wherein the forming of the phase change stack comprises a plurality of formations of first alternate layers with a plurality of formations of second layers (22), such that the phase change stack is a multilayer structure comprising a plurality of first and second alternate layers.

15. The method of claim 14, wherein at least one of the first layers have different thicknesses, and/or at least one of the second layers have different thicknesses, such that the multilayer structure of the phase change stack is aperiodic.

16. The method of claim 1, wherein the substrate comprises a lower electrode configured to make a phase change of the phase change stack.

17. The method of claim 1, wherein each van der Waals pseudo-gap separating two layers of the crystallographic structure is formed as a spacing between two pure planes of one same atom type, and wherein the spacing has a dimension normal to the planes less than or equal to twice a van der Waals radius of the atom type.

18. The method of claim 4, wherein the phase change device is a phase change memory or a thermoelectric converter.

19. The method of claim 1, wherein parameters of the first curing annealing are chosen such that the phase change stack has, after the first curing annealing, a once-annealed defect rate less than 20% of an initial defect rate of the phase change stack, taken before the first curing annealing.

20. A method for manufacturing a phase change stack, the method comprising:

forming a phase change stack on a surface of a substrate, comprising (i) forming a first layer comprising a first material A, and (ii) forming a second layer, comprising a second material B, different from the first material A, on the first layer; and after the forming of the phase change stack, first curing annealing such that the phase change stack has, after the curing annealing, a once-annealed defect rate less than 50% of an initial defect rate of the phase change stack, taken before the curing annealing, wherein the phase change stack has a crystallographic structure made of layers separated by van der Waals pseudo-gaps and comprises:

the first layer of the first material A, and the second layer of the second material B, wherein each van der Waals pseudo-gap separating two layers of the crystallographic structure is formed as a spacing between two pure planes of one same atom type, and wherein the spacing has a dimension normal to the planes less than or equal to twice a van der Waals radius of the atom type.

* * * * *